US012153269B2

(12) United States Patent
Pratap et al.

(10) Patent No.: US 12,153,269 B2
(45) Date of Patent: Nov. 26, 2024

(54) ACTIVE OPTICAL COUPLER

(71) Applicant: Intel Corporation, Santa Clara, CA (US)

(72) Inventors: Divya Pratap, Hillsboro, OR (US); Srikant Nekkanty, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 765 days.

(21) Appl. No.: 17/132,955

(22) Filed: Dec. 23, 2020

(65) Prior Publication Data
US 2022/0196942 A1  Jun. 23, 2022

(51) Int. Cl.
*H04B 10/00* (2013.01)
*G02B 6/42* (2006.01)
*H01L 23/538* (2006.01)

(52) U.S. Cl.
CPC ......... *G02B 6/4286* (2013.01); *G02B 6/4214* (2013.01); *G02B 6/423* (2013.01); *G02B 6/4269* (2013.01); *G02B 6/4292* (2013.01); *H01L 23/538* (2013.01)

(58) Field of Classification Search
CPC .... G02B 6/4286; G02B 6/4214; G02B 6/423; G02B 6/4269; G02B 6/4292; G02B 6/4225; G02B 6/4257; G02B 6/426; G02B 6/428; G02B 6/4287; G02B 6/264; G02B 6/4204; G02B 6/4219; G02B 6/4274; H01L 23/538
See application file for complete search history.

(56) References Cited

U.S. PATENT DOCUMENTS

| 4,904,036 | A  | * | 2/1990  | Blonder     | H01L 31/12   |
|           |    |   |         |             | 257/E25.032  |
| 6,895,147 | B2 | * | 5/2005  | Posamentier | G02B 6/4214  |
|           |    |   |         |             | 385/47       |
| 9,547,142 | B1 | * | 1/2017  | Chen        | G02B 6/4286  |
| 11,432,056| B1 | * | 8/2022  | Doerr       | H04B 10/25   |
| 2002/0171823 | A1 | * | 11/2002 | Shurgalin | C03B 37/0253 |
|           |    |   |         |             | 356/73.1     |
| 2003/0030786 | A1 | * | 2/2003  | Shurgalin | G01M 11/31   |
|           |    |   |         |             | 356/73.1     |

(Continued)

OTHER PUBLICATIONS

Search Report for European Patent Application No. 21209148.2, mailed Apr. 22, 2022, 9 pgs.

(Continued)

*Primary Examiner* — Agustin Bello
(74) *Attorney, Agent, or Firm* — Schwabe, Williamson & Wyatt P.C.

(57) ABSTRACT

Embodiments described herein may be related to apparatuses, processes, and techniques related to active optical couplers that provide optical coupling at or proximate to an edge of a silicon photonics package, to allow the package to optically couple with other devices or peripherals. In embodiments, the active optical coupler is optically coupled with a photonics IC (PIC) inside the photonics package, and provides an optical coupling mechanism for optical pathways outside the photonics package. The active optical coupler may include electrical circuitry and may be coupled to the package substrate to provide data related to the operation of the active optical coupler. Other embodiments may be described and/or claimed.

25 Claims, 12 Drawing Sheets

(56) References Cited

U.S. PATENT DOCUMENTS

| | | | | |
|---|---|---|---|---|
| 2004/0105611 A1* | 6/2004 | Bischel | ................ | G02B 6/4243 385/14 |
| 2004/0190833 A1* | 9/2004 | Mori | ................ | G02B 6/29361 385/50 |
| 2004/0208458 A1* | 10/2004 | Uno | ................ | G02B 6/4215 385/89 |
| 2005/0002607 A1* | 1/2005 | Neuhaus | ................ | G02B 6/2804 385/31 |
| 2005/0248822 A1* | 11/2005 | Tohgoh | ................ | G02B 6/4214 359/31 |
| 2008/0260379 A1* | 10/2008 | Beranek | ................ | G01M 11/37 398/21 |
| 2011/0097045 A1* | 4/2011 | Benabid | ............ | G02B 6/02328 65/393 |
| 2011/0129231 A1* | 6/2011 | Fiorentino | ........... | G02B 6/4204 398/141 |
| 2016/0226592 A1* | 8/2016 | Arvelo | ................ | G02B 6/425 |
| 2017/0015585 A1* | 1/2017 | Sezerman | ............. | B23K 26/60 |
| 2019/0302373 A1* | 10/2019 | Sezerman | ......... | G02B 6/29385 |
| 2020/0003971 A1* | 1/2020 | Seyedi | ................ | G02B 6/4286 |
| 2020/0271873 A1* | 8/2020 | Chang | ................ | G02B 6/4253 |
| 2020/0279840 A1* | 9/2020 | Janta-Polczynski | ..... | G02B 6/30 |
| 2022/0196942 A1* | 6/2022 | Pratap | ................ | G02B 6/423 |
| 2023/0152537 A1* | 5/2023 | Witzens | ................ | G02B 6/34 385/33 |
| 2023/0228953 A1* | 7/2023 | Venkatesan | ......... | G02B 6/4249 385/52 |

OTHER PUBLICATIONS

Office Action for European Patent Application No. 21209148.2, mailed Sep. 18, 2024, 8 pgs.

* cited by examiner

ACTIVE OPTICAL COUPLER

FIELD

Embodiments of the present disclosure generally relate to the field of semiconductor packaging, and in particular to photonics coupling to a photonics package.

BACKGROUND

Continued growth in virtual machines and cloud computing will increase the demand for reliable manufactured semiconductor packages, including optical packages.

DETAILED DESCRIPTION

Figure 1:
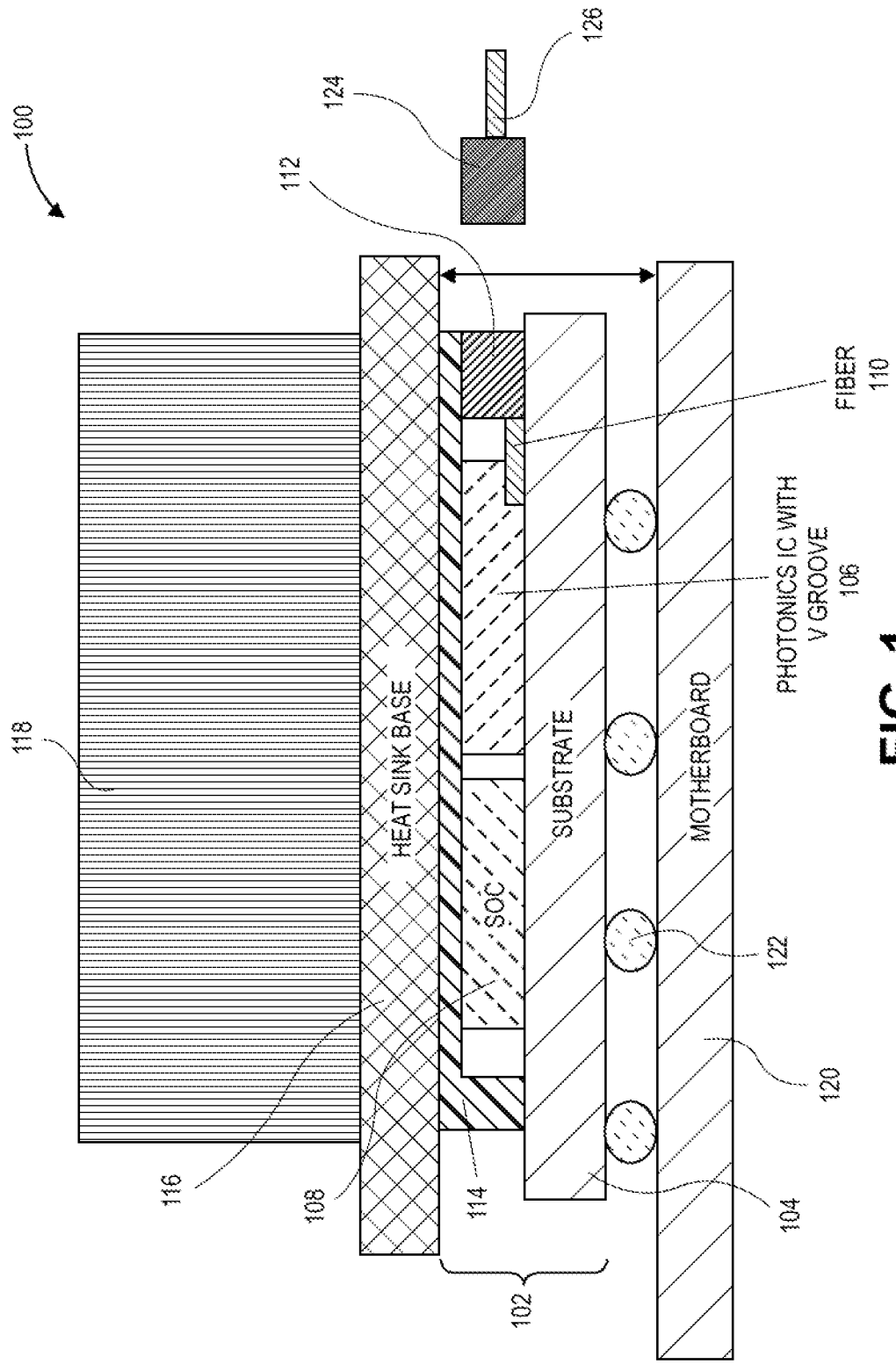
FIG. 1 illustrates a photonics package on a motherboard with an optical coupler at an edge of the package.

Embodiments described herein may be related to apparatuses, processes, systems, and techniques related to optical couplers that provide optical coupling at or proximate to an edge of a photonics package, to allow the package to couple with other devices or peripherals. In embodiments, the optical coupler is optically coupled with a photonics IC (PIC) inside the photonics package, and provides an optical coupling mechanism for optical pathways outside the photonics package. In embodiments, the photonics packages may have a PIC that is in close physical proximity to a system-on-a-chip (SOC) or some other processing die, that may require the PIC to be disposed in a central position within the photonics package. In embodiments, optical couplers may allow a convenient way for customers to optically couple photonics packages.

In addition, in embodiments, the optical coupler may not be in physical contact with the heat spreader. This may result in a gap between the heat spreader and the optical coupler to allow access to internal chambers of the photonics package. This access may facilitate cleaning of the package, for example as a part of regular maintenance of systems of which the photonics package is a part. In embodiments, this access may also facilitate disassembly of the package for cleaning or other maintenance procedures. Embodiments described herein may be directed to facilitating ease-of-use for optical coupling, while still keeping the fiber-connector assembly limited to the photonics package, which may also be referred to as the photonics package footprint.

Embodiments may also describe active optical couplers that may physically couple with a substrate of the photonics package and also electrically couple with the substrate to provide monitoring and/or telemetry data for the operation of the active optical coupler. Embodiments may also describe various adapters which can overhang or extend the reach of an optical coupler outside of the heatsink shadow, as well as provide additional optical pathway routing and/or analysis function of the performance of the adapter.

These embodiments may enable a highly reliable optical coupling mechanism, and may also facilitate optical signal monitoring on-field, such as customer sites. In embodiments, such active optical couplers and adapters may include circuitry monitoring that includes optical signal strength, may have optical fiber already attached, may be mounted on a motherboard or other substrate, or may be coupled with thermal hardware or other package structures to give structural rigidity and alignment for the coupler or adapter. In embodiments, the adapter may include lenses for optical transmission, and may include PCF fibers integrated within the adapter to facilitate operational analysis and reporting. In embodiments, the adapter may also enable telemetry to monitor and store optical signal strength.

Photonics packages that include a silicon photonic engine/optical fiber module are increasingly being included in a same package as the main SOC. Such legacy packaging solution involves assembly of optical fiber connector sub-assemblies (referred to as "pigtails") attached to the PIC. It is desirable to limit the length of these pigtails within a photonics package footprint for high volume manufacturing and assembly, test, and shipping and handling of these packages. Implementations that include passive fiber connectors within a photonics package footprint may create difficulty for mating with external connectors. A customer must reach underneath a heatsink base that typically overhangs a heat spreader to connect the mail optical fiber connector. In addition, plugging in and unplugging male or female connectors becomes complex and impractical as the heatsink, or other system thermal solution, must be disassembled and reassembled after deployment for periodic cleaning.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an ASIC, an electronic circuit, a processor (shared, dedicated, or group) and/or memory (shared, dedicated, or group) that execute one or more software or firmware programs, a combinational logic circuit, and/or other suitable components that provide the described functionality.

Various Figures herein may depict one or more layers of one or more package assemblies. The layers depicted herein are depicted as examples of relative positions of the layers of the different package assemblies. The layers are depicted for the purposes of explanation, and are not drawn to scale. Therefore, comparative sizes of layers should not be assumed from the Figures, and sizes, thicknesses, or dimensions may be assumed for some embodiments only where specifically indicated or discussed.

FIG. 1 illustrates a photonics package on a motherboard with an optical coupler at an edge of the package. System 100 shows a photonics package 102 that includes a substrate 104, a PIC 106 and SOC 108 coupled with substrate 104. In implementations, the SOC 108 may be an XPU, a central processing unit (CPU), a graphics processing unit (GPU), field programmable gate array (FPGA), an application specific integrated circuit (ASIC), an accelerator, or some other processing chip or die. In implementations, the SOC 108 and the PIC 106 may be electrically coupled (not shown) using an interconnect bridge, an embedded multi-die interconnect bridge (EMIB), a silicon interposer, organic routing on the substrate 104 or a redistribution layer (RDL) on the substrate 104. Note that the optical connector 112 in legacy implementations may be physically coupled with substrate 104, but not electrically coupled.

Optical fibers 110 may optically couple the PIC 106 with the optical connector 112. In implementations, a heat spreader 114 thermally couples and/or physically couples with the SOC 108, the PIC 106, and the optical connector 112. In implementations, the heat spreader 114 physically couples with the substrate 104. In implementations, the optical fibers 110 may be waveguides, open air channels, or some other optical pathway to allow optical coupling between the PIC 106 and the connector 112 within the photonics package 102. In implementations, a heatsink base 116 may be thermally and/or physically coupled with the heat spreader 114. Other cooling elements, for example cooling fins 118, may be thermally and physically coupled to the heatsink base 116.

As shown, the photonics package 102 may be coupled with a motherboard 120 via a ball grid array (BGA) 122. In embodiments, other electrical and/or physical coupling methods and techniques may be used to couple the motherboard 120 with the substrate 104. In implementations, an external connector 124 that is optically coupled with optical fibers 126, may be owned by a customer and inserted into connector 112 by the customer during installation. Note that it is difficult to reach underneath the heatsink base 116 and the heat spreader 114 to plug in the connector 124 to optical connector 112. Plugging and unplugging the connector 124 may be difficult without disassembling the heatsink 116 or the heat spreader 114 from the photonics package 102.

Figure 2:
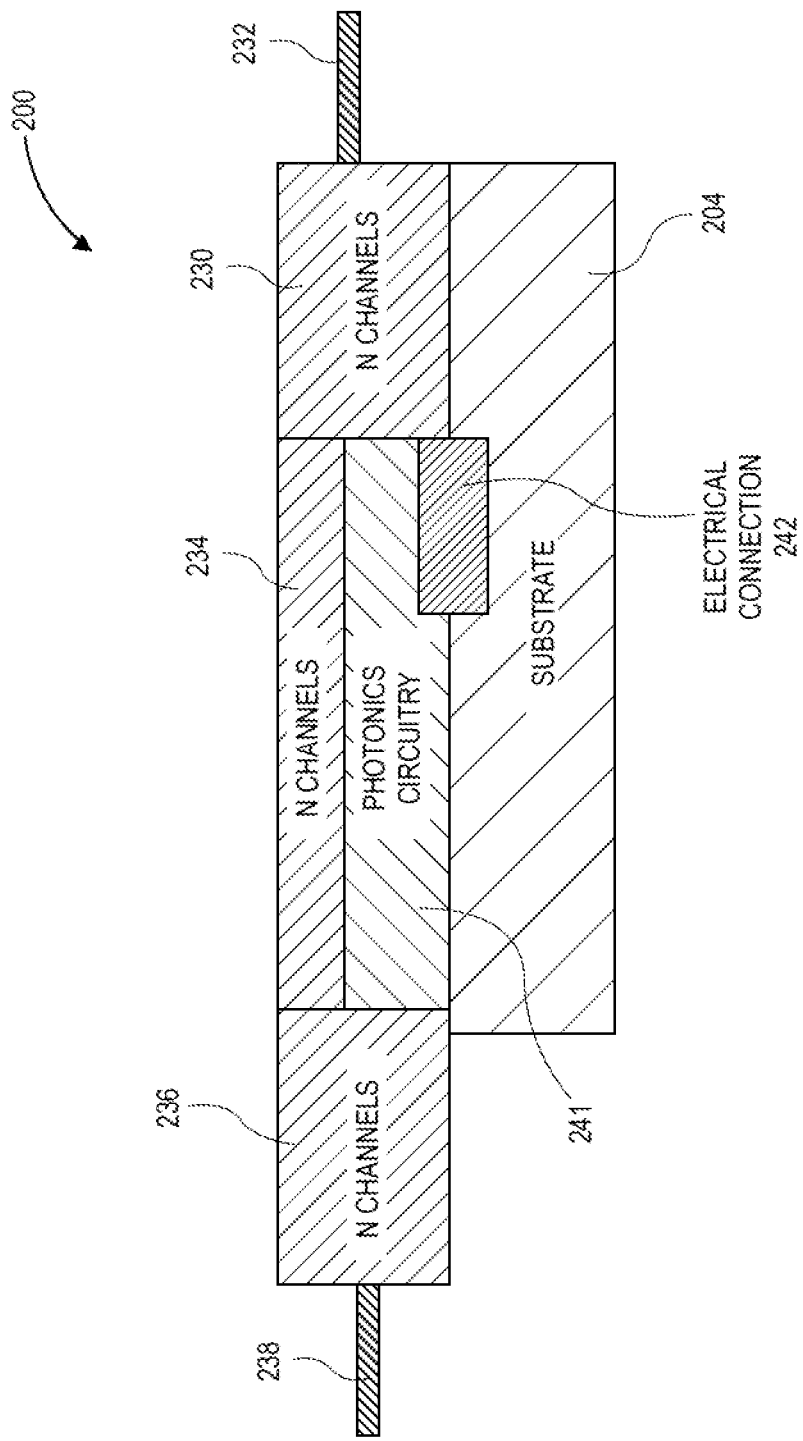
FIG. 2 illustrates a functional diagram of an active optical coupler, in accordance with various embodiments.

FIG. 2 illustrates a functional diagram of an active optical coupler, in accordance with various embodiments. Active optical coupler 200, which may be similar to optical coupler 112 of FIG. 1, includes a first optical interface 230 to receive light signals from up to N channels from optical fibers 232. In embodiments, the first optical interface 230 may include a physical socket (not shown) or other similar receiving features to facilitate the insertion of the optical fibers 232, into the first optical interface 230. For example, using a coupler such as coupler 124 of FIG. 1. Optical paths 234 couple light received from the first optical interface 230 to a second optical interface 236. In embodiments, the optical paths 234 may include waveguides, one or more optical fibers, or open air connectors to allow an optical coupling between the first optical interface 230 and the second optical interface 236, that may be optically coupled with optical fibers 238.

The active optical coupler 200 may also include photonics circuitry 241 that may be used to sample and/or monitor the light traveling in the optical paths 234. In embodiments, the photonics circuitry 241 may include one or more single-channel splitters, photodiodes, and other photonics-related components to sense and to collect operational data related to the active optical coupler 200. The photonics circuitry 241 may also be used to monitor other operational aspects of the active optical coupler 200 outside of optical performance, for example operating temperature or bandwidth.

In embodiments, the photonics circuitry 241 may be electrically coupled via an electrical connection 242 to a substrate 204, which may be similar to substrate 104 of FIG. 1. In other embodiments, electrical connection 242 may be coupled to a motherboard, such as motherboard 120 of FIG. 1. In embodiments, the electrical connection 242 may provide an electrical coupling with some other processing or storage component (not shown), for example with the PIC 106, and/or the SOC 108 of FIG. 1. In embodiments, the electrical connection 242 may be an interconnect bridge, such as an EMIB, or a silicon interposer, organic routing on the substrate 204 or a RDL on the substrate 204, or some other electrical coupling. In embodiments, the electrical coupling may be a high density electrical coupling. Using the electrical connection 242, data collected by the photonics circuitry 241 may enable telemetry regarding the operation of the active optical coupler 200.

For example, the active optical coupler 200 may actively draw current from the substrate 204, or leverage onboard amplifiers on the motherboard or pre-existing integrated circuits on the PIC 106 of FIG. 1 to measure, monitor, or store, for example, optical signal strength. In embodiments, the photonics circuitry 241 may include an N+1 channel adapter, which may include N optical channels for regular transmission and reception of optical signals, and 1 channel to enable telemetry. The N+1 channel adapter may include a single-channel splitter that operates in a special mode to periodically monitor and store optical output power of the active optical coupler 200. In embodiments, the active optical coupler 200, with varying components in the photonics circuitry 241, may be configured for benchtop, on-field, or final system-level testing.

Figure 3:
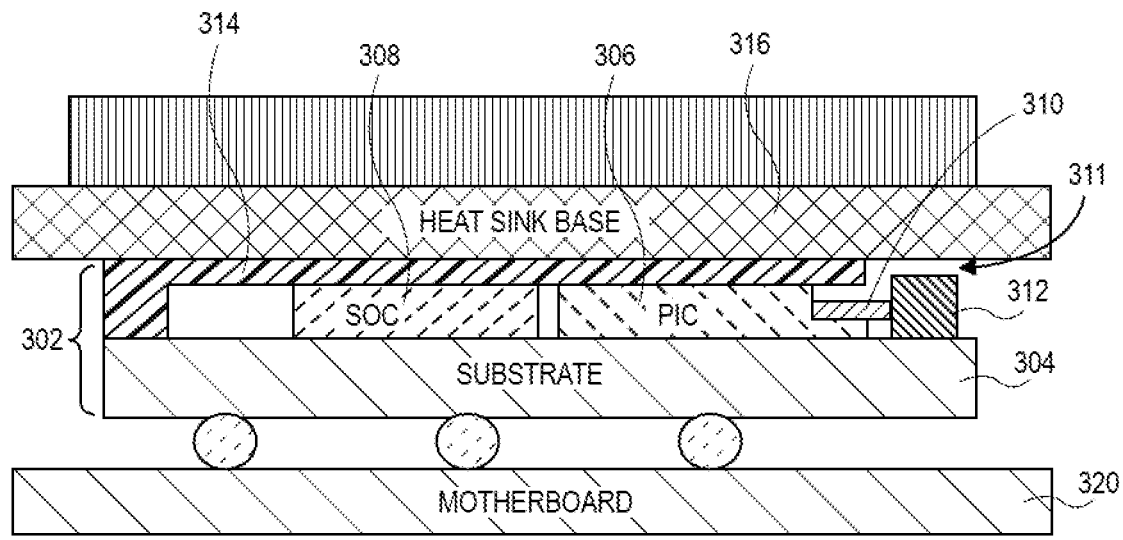
FIG. 3 illustrates one example of incorporating an active optical coupler into a photonics package, in accordance with various embodiments.

FIG. 3 illustrates one example of incorporating an active optical coupler into a photonics package, in accordance with various embodiments. Photonics package 302, which may be similar to photonics package 102 of FIG. 1, is coupled with a motherboard 320, which may be similar to motherboard 120 of FIG. 1. Package 302 includes substrate 304, coupled with PIC 306 and SOC 308, which may be similar to substrate 104, PIC 106, and SOC 108 of FIG. 1. Active optical coupler 312, which may be similar to active optical coupler 200 of FIG. 2, is shown optically coupled with the PIC 306 through optical couplings 310. In embodiments, the optical couplings 310 may be fibers, a waveguide, or an open air channel.

The active optical coupler 312 may be physically coupled with the substrate 304. In embodiments, this physical coupling may be accomplished through application of an adhesive, such as an epoxy, between the active optical coupler 312 and the substrate 304, mechanical cuts such as holes or grooves within the substrate, or by soldering. Note that air gap 311 exists between the heatsink base 316, which may be similar to heatsink base 116 of FIG. 1, and the active optical coupler 312 to provide physical access into the photonics package 302. Note that in embodiments, the heat spreader 314, which may be similar to heat spreader 114 of FIG. 1, does not come into contact with the active optical coupler 312.

Figure 4:
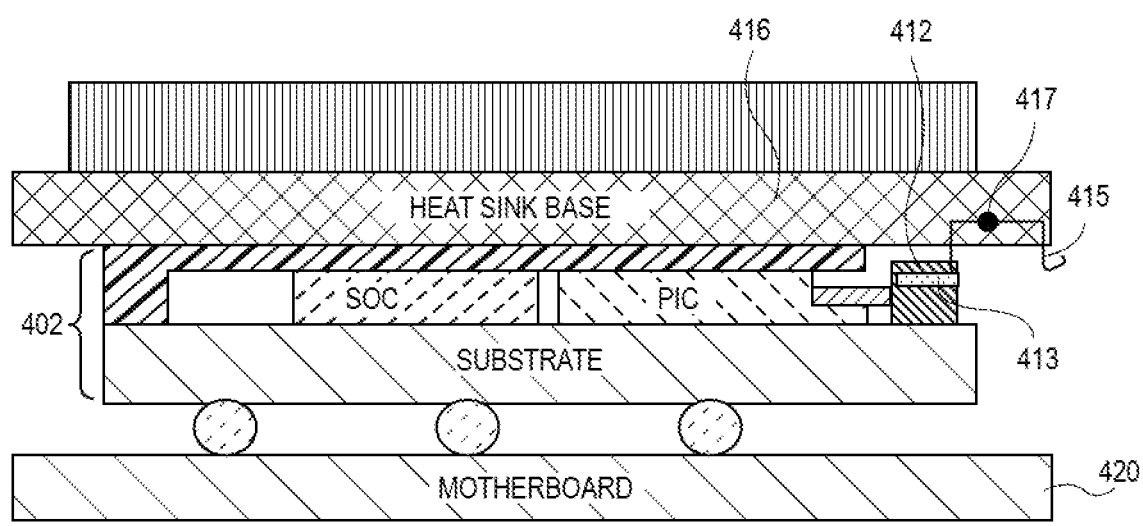
FIG. 4 illustrates another example of incorporating an active optical coupler into a photonics package that includes a retention feature, in accordance with various embodiments.

FIG. 4 illustrates another example of incorporating an active optical coupler into a photonics package that includes a retention feature, in accordance with various embodiments. Photonics package 402 coupled with a motherboard 420 may be similar to photonics package 302 coupled with motherboard 320 of FIG. 3. The active optical coupler 412, which may be similar to active optical coupler 312 of FIG. 3, includes a guide hole 413 in the active optical coupler 412 to facilitate accurate alignment when an external optical coupler is inserted into the active optical coupler 412. For example, an alignment pin may insert into guide hole 413. In embodiments, there may be multiple guide holes 413 to receive multiple alignment pins that may be a part of the external optical coupler. Note that the guide hole 413 is shown as a hole, however it may have any shape, extending into or extending out of the active optical coupler 412.

In addition, a retention mechanism 415 may be coupled with the heatsink base 416, which may be similar to heatsink base 316 of FIG. 3. In embodiments, this retention mechanism 415 may be a spring that is secured to the heatsink base 416 using a pin 417. Other embodiments may use some other securing mechanism. In embodiments, there may be one or more retention mechanisms 415 coupled with heatsink base 416. As shown, the retention mechanism 415 may be bent, or have another shape and/or other features, that may press against a side of an external optical coupler to provide a mechanical force to secure the external optical coupler to the active optical coupler 412.

Figure 5:
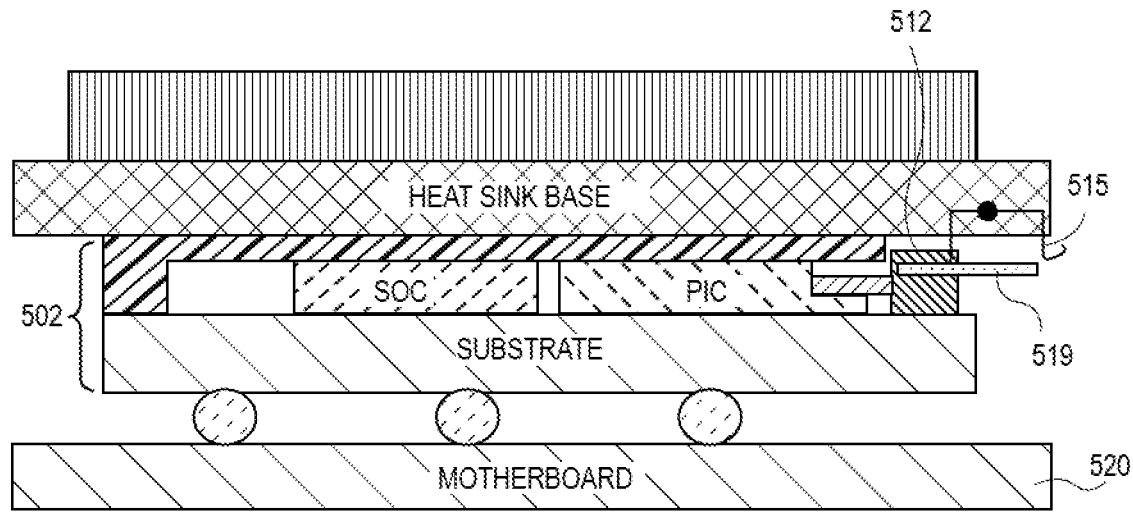
FIG. 5 illustrates another example of incorporating an active optical coupler with alignment pins into a photonics package, in accordance with various embodiments.

FIG. 5 illustrates another example of incorporating an active optical coupler with alignment pins into a photonics package, in accordance with various embodiments. Photonics package 502 coupled to a motherboard 520 may be similar to photonics package 402 coupled to a motherboard 420 of FIG. 4. The active optical coupler 512, which may be similar to active optical coupler 412 of FIG. 4, may include a retention mechanism 515, which may be similar to retention mechanism 415 of FIG. 4. As shown, the active optical coupler 512 may include an alignment pin 519 that is physically coupled with the active optical coupler 512. In embodiments, there may be more than one alignment pin 519. In embodiments, the alignment pin 519 is to fit into an alignment hole in an external optical coupler as described further below.

Figure 6:
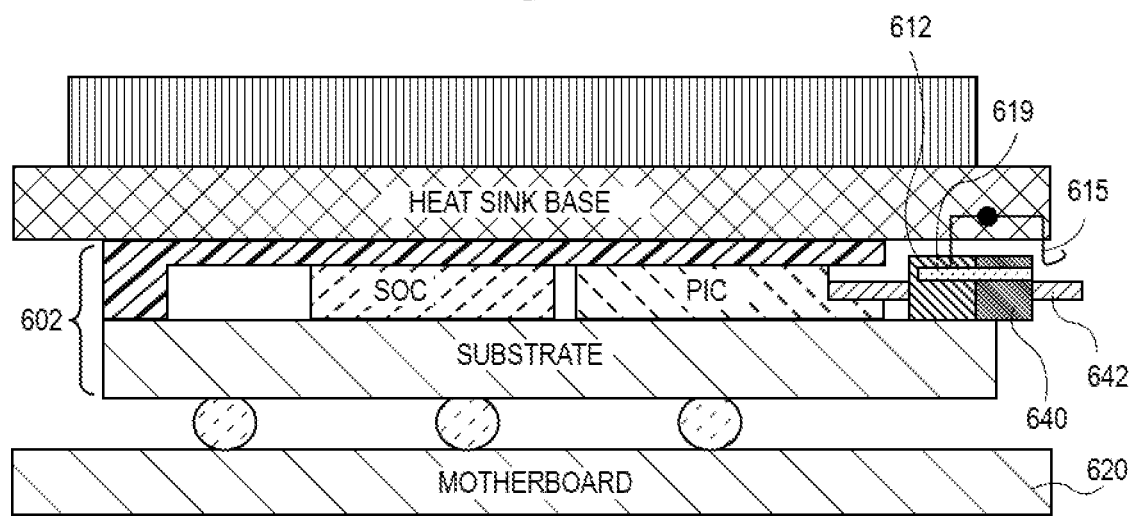
FIG. 6 illustrates another example of incorporating an active optical coupler with alignment holes into a photonics package, in accordance with various embodiments.

FIG. 6 illustrates another example of incorporating an active optical coupler with alignment holes into a photonics package, in accordance with various embodiments. Photonics package 602 coupled to a motherboard 620 may be similar to photonics package 502 coupled to a motherboard 520 of FIG. 5. Here, the active optical coupler 612, which may be similar to active optical coupler 512 of FIG. 5, is physically and optically coupled with an external optical coupler 640. The external optical coupler 640 may be optically coupled with one or more optical fibers 642.

The pin 619, which may be similar to pin 519 of FIG. 5, may be inserted between the active optical coupler 612 and the external optical coupler 640. In embodiments, there may be multiple pins 619. These pins 619 may be used to precisely align the surfaces of the optical pads, for example optical fibers, when the external optical coupler 640 and the active optical coupler 612 are coupled. In addition, retention mechanism 615, which may be similar to retention mechanism 515 of FIG. 5, is shown applying pressure to a side of the external optical coupler 642. This applied pressure may provide a mechanical pressure to facilitate a high-quality optical coupling between the active optical coupler 612 and the external optical coupler 640 and retention of the external coupler 640

Note that in embodiments described herein, the external optical coupler 640 may be a male coupler, and the active optical coupler 612 may be a female coupler, or the external optical coupler 640 may be a female coupler, and the active optical coupler 612 may be a male coupler.

Figure 7:
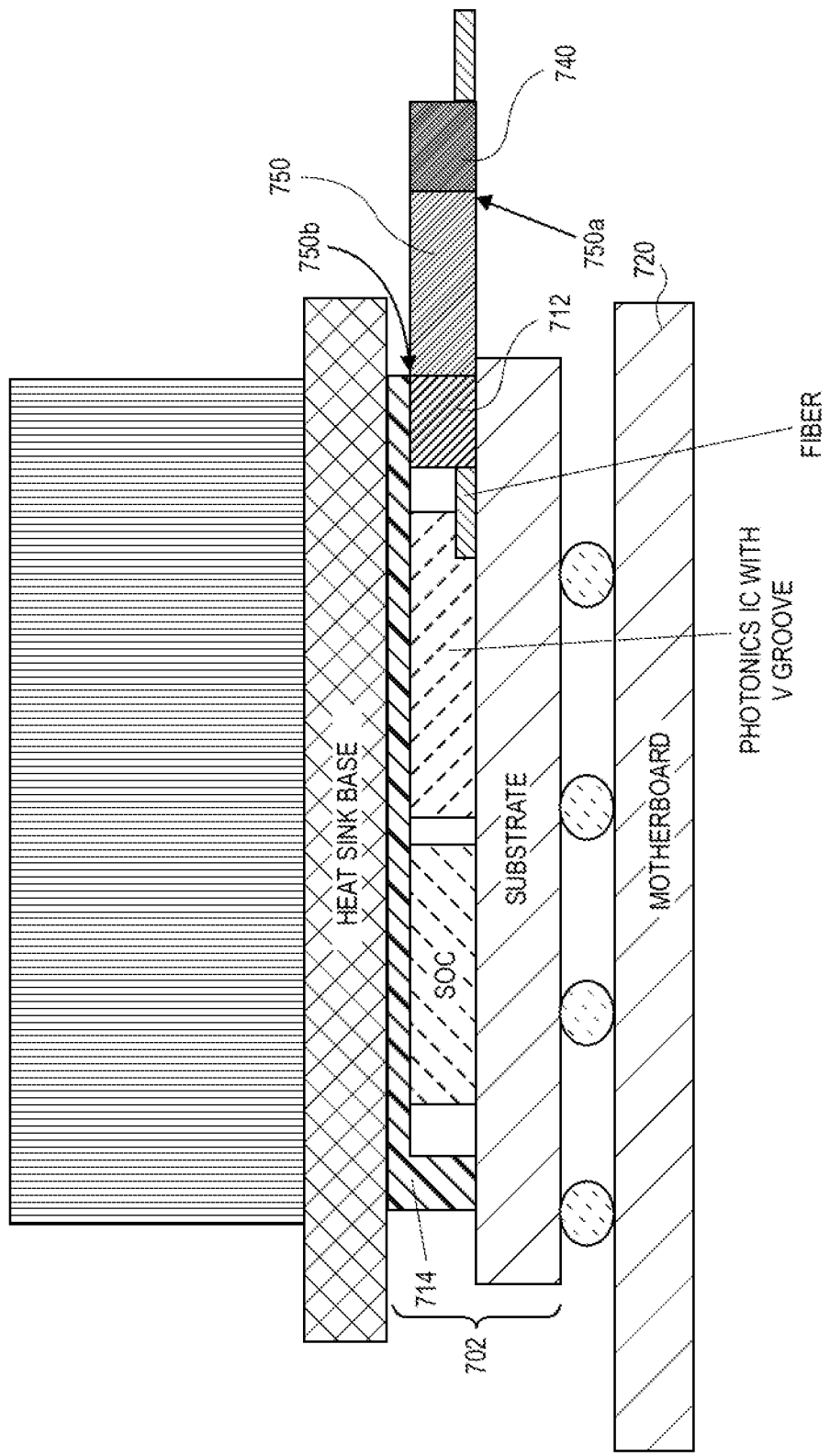
FIG. 7 illustrates a removable optical adapter, in accordance with various embodiments.

FIG. 7 illustrates a removable optical adapter, in accordance with various embodiments. Photonics package 702, which may be similar to photonics package 602 of FIG. 6, may be coupled to a motherboard 720 which may be similar to motherboard 620 of FIG. 6. The optical coupler 712, which may be similar to active optical coupler 612 of FIG. 6 or the optical coupler 112 of FIG. 1, may be physically and optically coupled with a removable optical adapter 750. In embodiments, the optical adapter 750 may be secured to a side of the optical coupler 712. The optical adapter 750 may be removably and optically coupled with the external optical coupler 740.

Optical adapter 750 may have a first side 750a that is to couple with the external optical coupler 740, and a second side 750b that is to couple with the optical coupler 712, which in embodiments may be active optical coupler. The first side 750a of the optical adapter 750 that is to couple with the external optical coupler 740 may be designed for one or more standard coupling configurations. Thus, the second side 750b of the adapter 750 may be designed in a configuration that may be unique to the configuration of the optical coupler 712.

The adapter 750, during operation, transmits optical signals received from the external optical coupler 740 the active optical coupler 712, and transmits optical signals received from the active optical coupler 712 to the external optical coupler 740.

Figure 8:
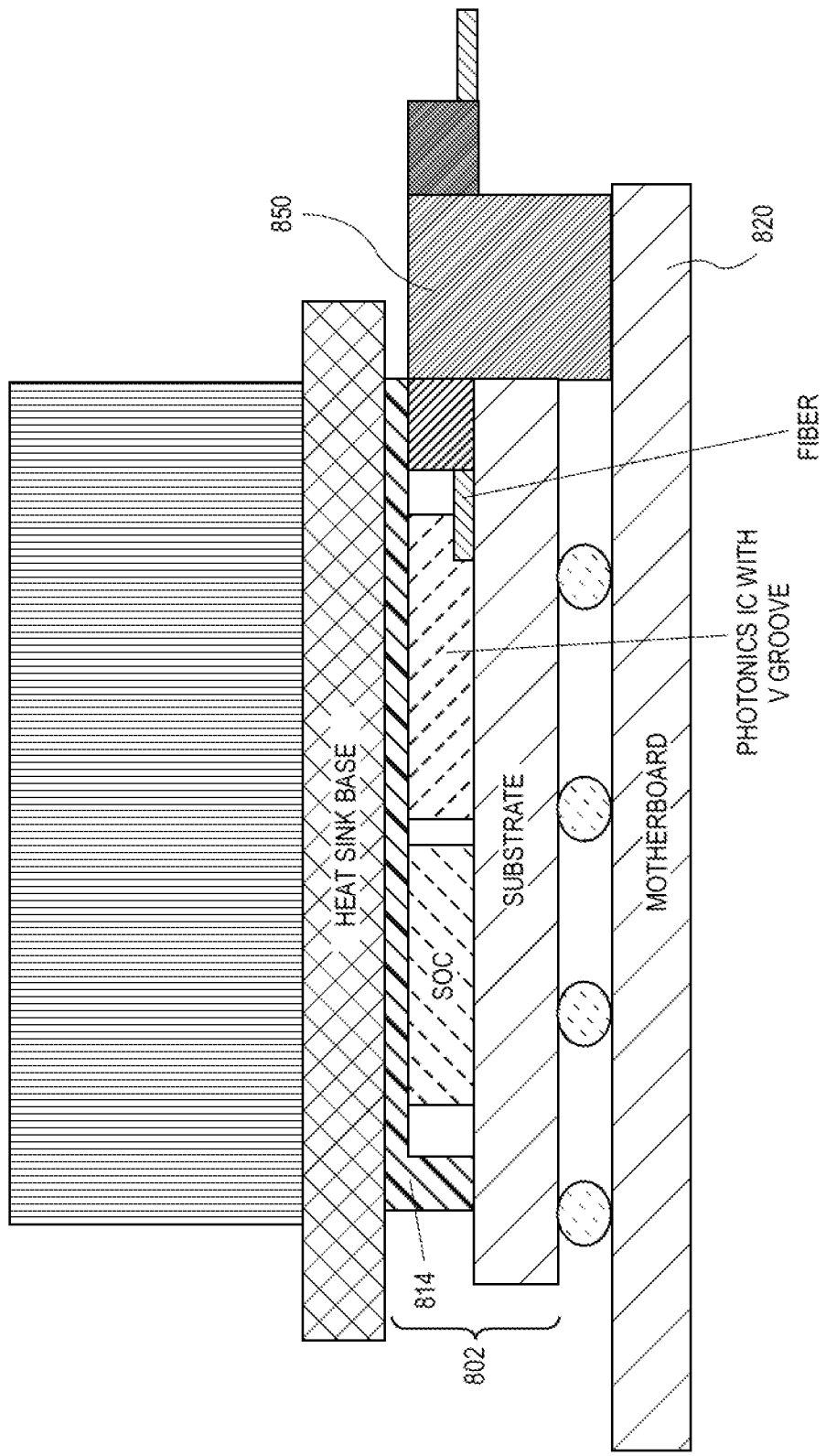
FIG. 8 illustrates an optical adapter mounted on a motherboard and coupled with a photonics package, in accordance with various embodiments.

FIG. 8 illustrates an optical adapter mounted on a motherboard and coupled with a photonics package, in accordance with various embodiments. Photonics package 802 is coupled with a motherboard 820, which may be similar to photonics package 702 coupled with a motherboard 720 of FIG. 7. The photonics package 802 may include an enhanced adapter 850, which may be similar to adapter 750 of FIG. 7. Enhanced adapter 850 may also be referred to as an optical coupling apparatus.

In embodiments, the enhanced adapter 850 may be physically coupled to the motherboard 820, which may be similar to motherboard 120 of FIG. 1. In embodiments, the enhanced adapter 850 may be electrically coupled with the motherboard 820. In embodiments, this electrical coupling may allow the enhanced adapter 850 to receive power from the motherboard. In embodiments, this electrical coupling may allow the enhanced adapter 850 to communicate via electrical signals to transmit and receive data between the motherboard 820 and the enhanced adapter 850. This data may include telemetry data of the enhanced adapter 850. In embodiments, the enhanced adapter 850 may not be physically coupled with the substrate 804, which may be similar to substrate 104 of FIG. 1. In other embodiments, the enhanced adapter 850 may be partially coupled with heat spreader 814, which may be similar to heat spreader 114 of FIG. 1.

Figure 9:
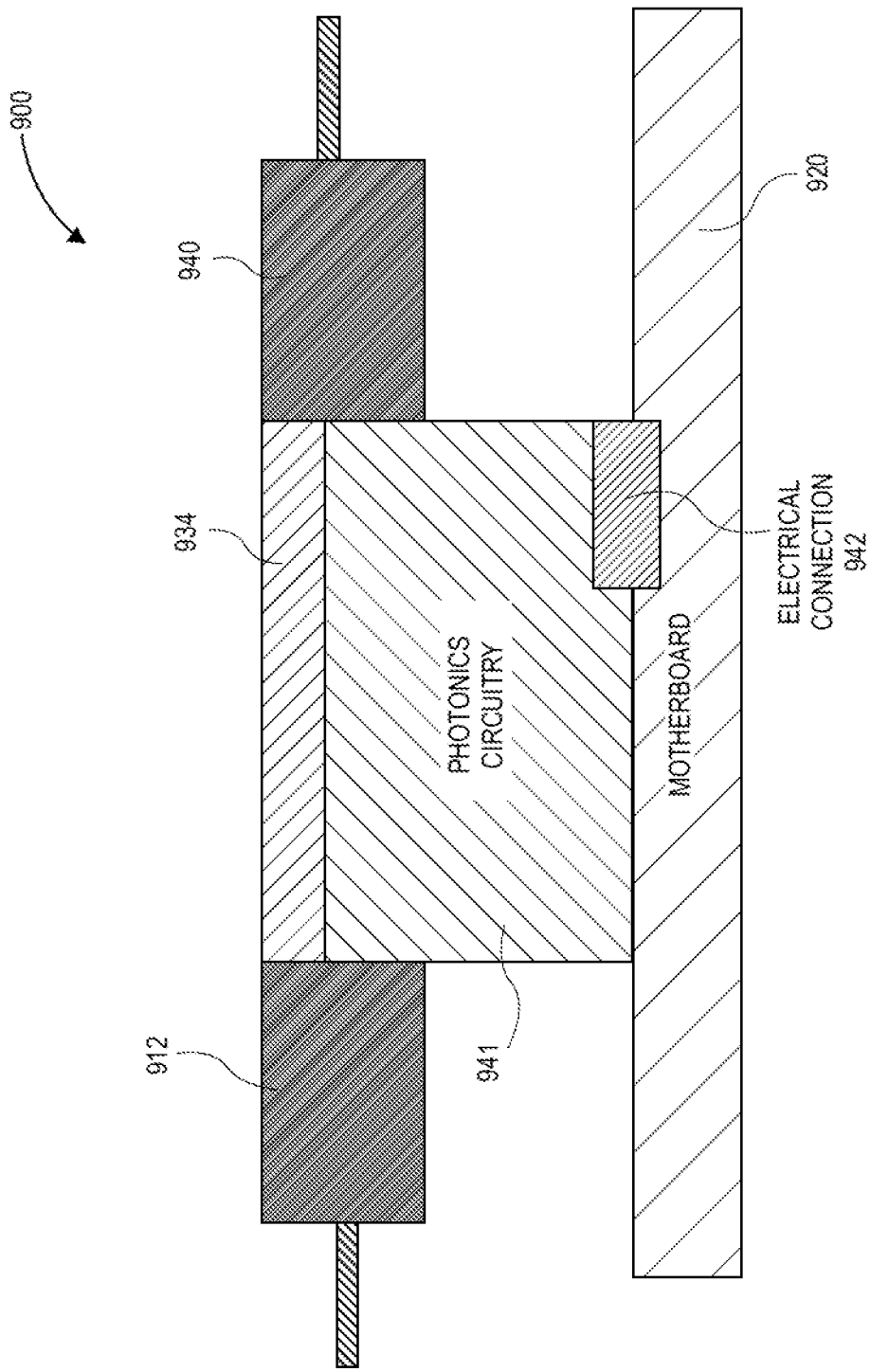
FIG. 9 illustrates details of an enhanced adapter, in accordance with various embodiments.

FIG. 9 illustrates details of an enhanced adapter, in accordance with various embodiments. Enhanced adapter 900, may be similar to enhanced adapter 850 of FIG. 8. Enhanced adapter 900 may be coupled with external optical coupler 940, which may be similar to external optical coupler 740 of FIG. 7. Enhanced adapter 900 may also be coupled with optical coupler 912, which may be similar to optical coupler 812 of FIG. 8. Note that in embodiments, the optical coupler 912 may be similar to optical coupler 112 of FIG. 1, or may be similar to active optical coupler 312 of FIG. 3.

Optical paths 934, which may be similar to optical paths to 234 of FIG. 2, two couple light signals between the external optical coupler 940 and the optical coupler 912. In embodiments, the optical paths 934 may include waveguides, one or more optical fibers, or open air connectors to facilitate the optical coupling. In embodiments, the optical paths 934 may include one or more fibers that are single mode (SM), multimode (MM), or polarization maintaining (PM) fibers.

The enhanced adapter 900 may also include photonics circuitry 941, which may be similar to photonics circuitry 241 of FIG. 2. Photonics circuitry 941 may be used to sample and/or monitor the light traveling in the optical paths 934. In embodiments, the photonics circuitry may include one or more single-channel splitters, photodiodes, and other photonics-related components to sense and to collect operational data, such as a temperature sensor. The photonics circuitry 941 may also be used to monitor other operational aspects of the enhanced adapter 900 outside of optical performance, for example operating temperature of the enhanced adapter 900.

In embodiments, the photonics circuitry 941 may be electrically coupled via electrical connection 942, which may be similar to electrical connection 242 of FIG. 2, to a motherboard 920, which may be similar to motherboard 820 of FIG. 8. In embodiments, the motherboard 920 may be a substrate or a PCB. In embodiments, the electrical connection 942 may provide an electrical coupling with some other processing or storage component (not shown), for example with the PIC 306, and/or the SOC 308 of FIG. 3.

In embodiments, the electrical connection 942 may be an interconnect bridge, such as an EMIB, or a silicon interposer, organic routing on a substrate such motherboard 920, or a RDL on motherboard 920, or some other electrical coupling. In embodiments, the electrical coupling may be a high density electrical coupling. Using the electrical connection 942, data collected by the photonics circuitry 941 may enable telemetry data sent via the motherboard 920 regarding the operation of the enhanced adapter 900.

For example, the enhanced adapter 900 may actively draw current from the motherboard 904, or may leverage onboard amplifiers or pre-existing integrated circuits on the PIC 306, and/or the SOC 308 of FIG. 3 to measure, monitor, or store, for example, optical signal strength. In embodiments, the enhanced adapter 900, with varying components in the photonics circuitry 941, may be configured for benchtop, on-field, or final system-level testing.

Figure 10:
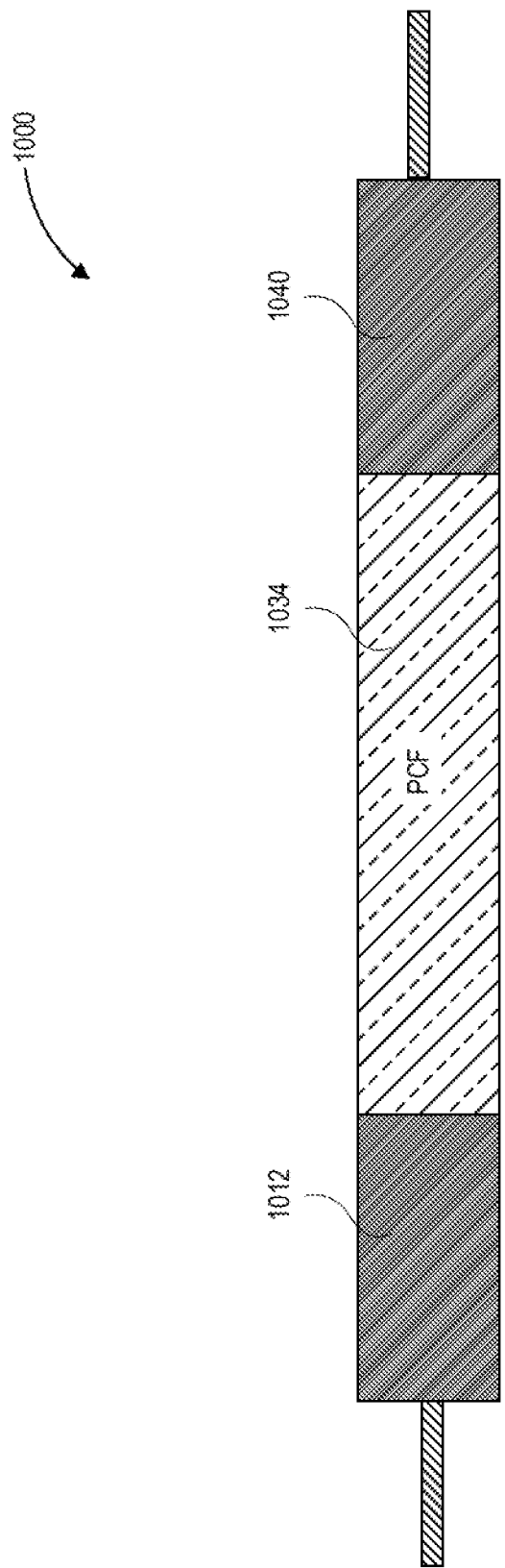
FIG. 10 illustrates an active optical coupler that includes photonic crystal fiber (PCF), in accordance with various embodiments.

FIG. 10 illustrates an enhanced adapter that includes photonic crystal fiber (PCF), in accordance with various embodiments. Enhanced adapter 1000 shows at least part of the components of enhanced adapter 900 of FIG. 9. In embodiments, the enhanced adapter 1000 may optically couple with an external optical coupler 1040, which may be similar to external optical coupler 940 of FIG. 9. The enhanced adapter 1000 may also optically couple with optical coupler 1012, which may be similar to optical coupler 912 of FIG. 9.

Optical paths 1034, which may be similar to optical paths 934 of FIG. 9, may include one or more optical fibers that are a photonic crystal fibers (PCF). In embodiments, PCFs may act as a physical sensor for temperature. In embodiments, the photonics circuitry 941 of FIG. 9 may receive and/or process this temperature data and provide it to other components as described above. In embodiments, the optical paths 1034 that include PCF may be included within enhanced adapter 850 of FIG. 8.

Figure 11:
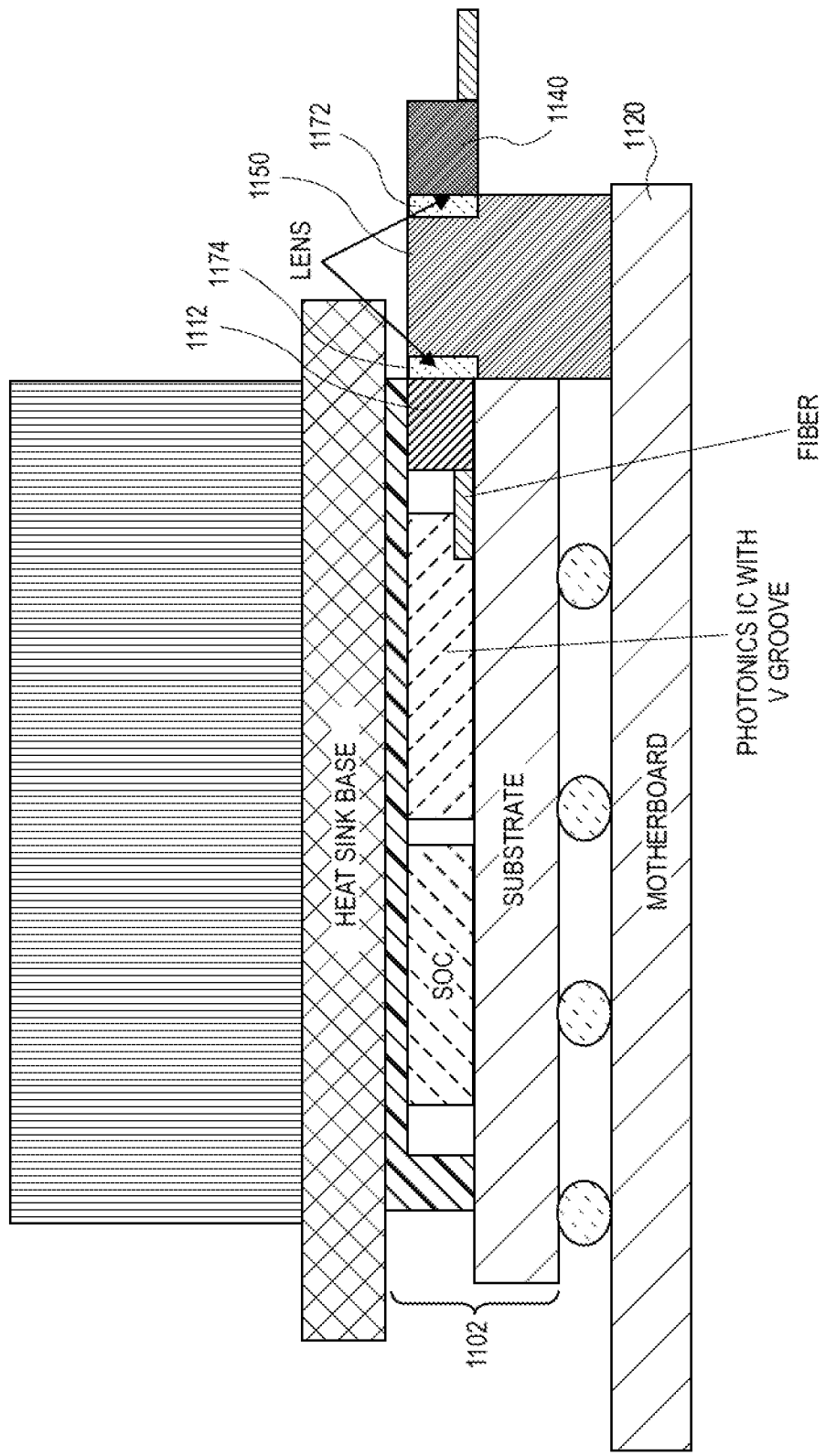
FIG. 11 illustrates an optical adapter mounted on a motherboard that includes optical lenses coupled with a photonics package, in accordance with various embodiments.

FIG. 11 illustrates an optical adapter mounted on a motherboard that includes optical lenses coupled with a photonics package, in accordance with various embodiments. Photonics package 1102 may be coupled with a motherboard 1120, which may be similar to photonics package 702 and a motherboard 720 of FIG. 7. Motherboard 1120 may include an enhanced adapter 1150, which may be similar to enhanced adapter 750 of FIG. 7. As shown, enhanced adapter 1150 may include lenses 1172, 1174 that are disposed respectively, adjacent to external optical coupler 1140, which may be similar to external optical coupler 740 of FIG. 7, and may be adjacent to optical coupler 1112, which may be similar to optical coupler 712 of FIG. 7.

In embodiments, the lenses 1172, 1174 may be lens arrays with a plurality of lenses to each transmit an optical channel. In embodiments, the enhance adapter 1150 may not contain any optical fibers, and instead use waveguides or open-air channels to optically couple the lenses 1172, 1174.

Figure 12:
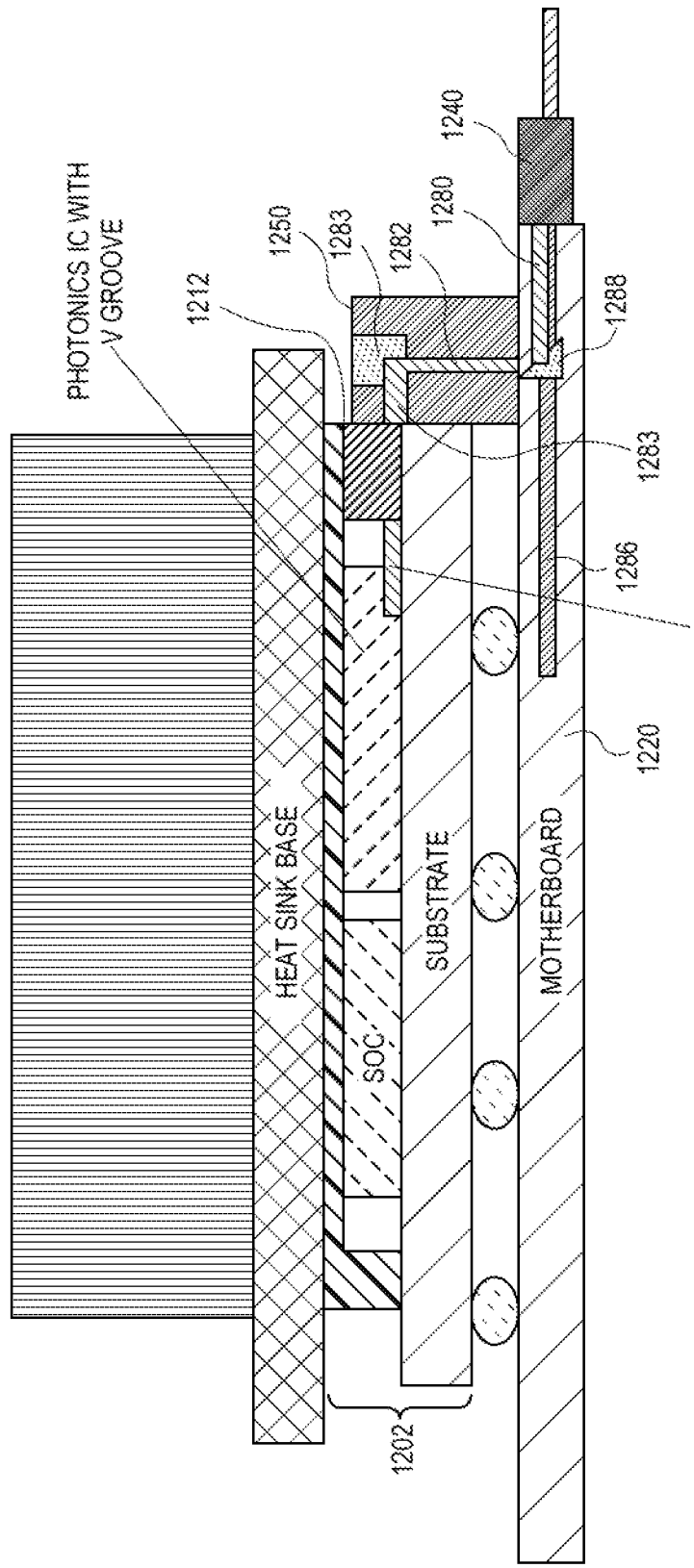
FIG. 12 illustrates an optical adapter mounted on a motherboard that includes an optical pathway to optically couple and optical layer of the motherboard with the photonics package, in accordance with various embodiments.

FIG. 12 illustrates an optical adapter mounted on a motherboard that includes an optical pathway to optically couple and optical layer of the motherboard with the photonics package, in accordance with various embodiments. Photonics package 1202 that is coupled with a motherboard 1220, which may be similar to photonics package 702 coupled with a motherboard 720 of FIG. 7, includes an enhanced adapter 1250, which may be similar to enhanced adapter 750 of FIG. 7.

In this embodiment, the enhanced adapter 1250 may include one or more optical paths 1282, 1283 to optically couple with optical coupler 1212, which may be similar to optical coupler 712 of FIG. 7. The one or more optical paths 1282, 1283 may optically couple with optical path 1280 within an optical layer 1286 of motherboard 1220, which may be similar to motherboard 720 of FIG. 7.

In this embodiment, there may be multiple optical routing features 1283, such as mirrors or reflectors, that may be included within the enhanced adapter 1250 to properly route the optical signals down optical paths 1282, 1283. In embodiments, the optical layer 1286 may include optical routing features 1288, such as mirrors or reflectors, to route optical signals received from an external optical coupler 1240. As shown, the external optical coupler 1240 may be optically coupled with the motherboard 1220. In embodiments, there may be coupling features (not shown) at an edge of the motherboard 1220 to physically and optically align external optical coupler 1240 with the with the optical layer 1286 of motherboard 1220.

Figure 13:
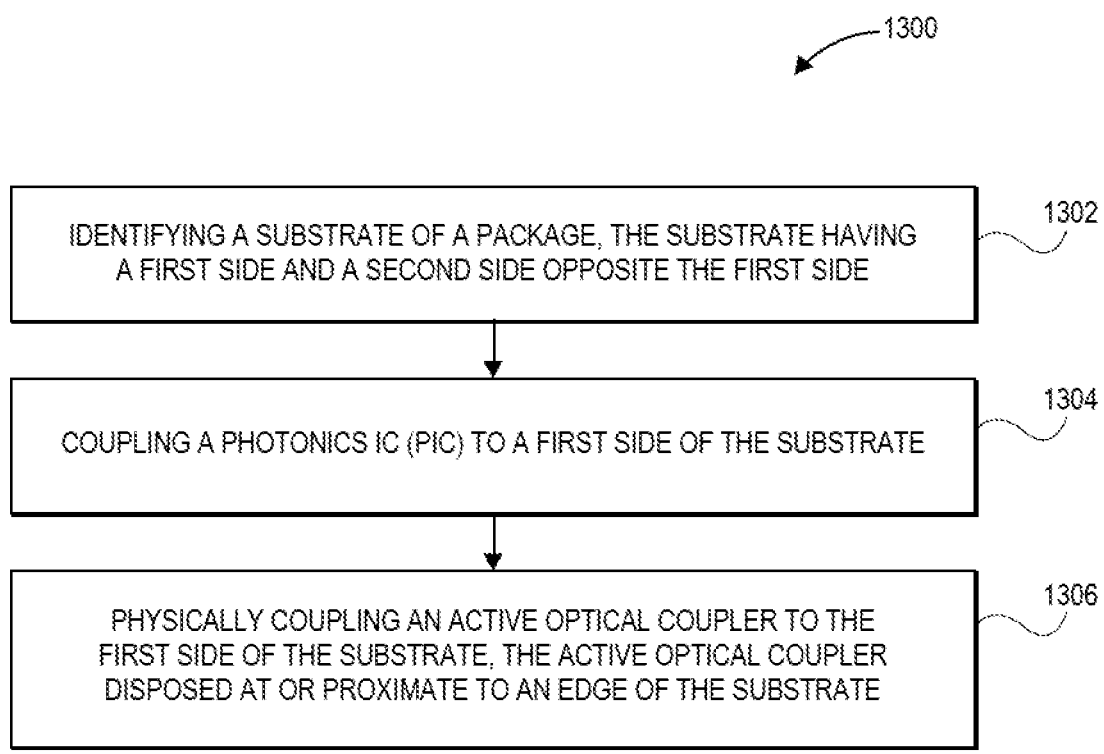
FIG. 13 is a process for implementing an active optical coupler with a photonics package, in accordance with various embodiments.

FIG. 13 is a process for implementing an active optical coupler with a photonics package, in accordance with various embodiments. Process 1300 may be implemented using apparatus, systems, techniques, or processes as described herein, and in particular with respect to FIGS. 1-12.

At block 1302, the process includes identifying a substrate of a package, the substrate having a first side and a second side opposite the first side. The substrate may be similar to at least substrate 104 of FIG. 1, 204 of FIG. 2, 304 of FIG. 3, 404 of FIG. 4, and 804 of FIG. 8. In embodiments, the first side of the substrate may be an active side, and the second side of the substrate may be a bottom side.

At block 1304, the process may further include coupling a PIC to the first side of the substrate. In embodiments, the PIC may at least be similar to PIC 106 of FIG. 1 and PIC 306 of FIG. 3, and as shown elsewhere in the Figures.

At block 1306, the process may further include physically coupling an enhanced optical coupler to the first side of the substrate, the active optical coupler disposed at or proximate to an edge of the substrate. In embodiments, the active optical coupler may include at least active optical couplers 312 of FIG. 3, 412 of FIG. 4, 512 of FIG. 5, 612 of FIG. 6, 712 of FIG. 7, 912 of FIG. 9, 1012 of FIG. 10, 1112 of FIG. 11, or 1212 of FIG. 12.

Figure 14:
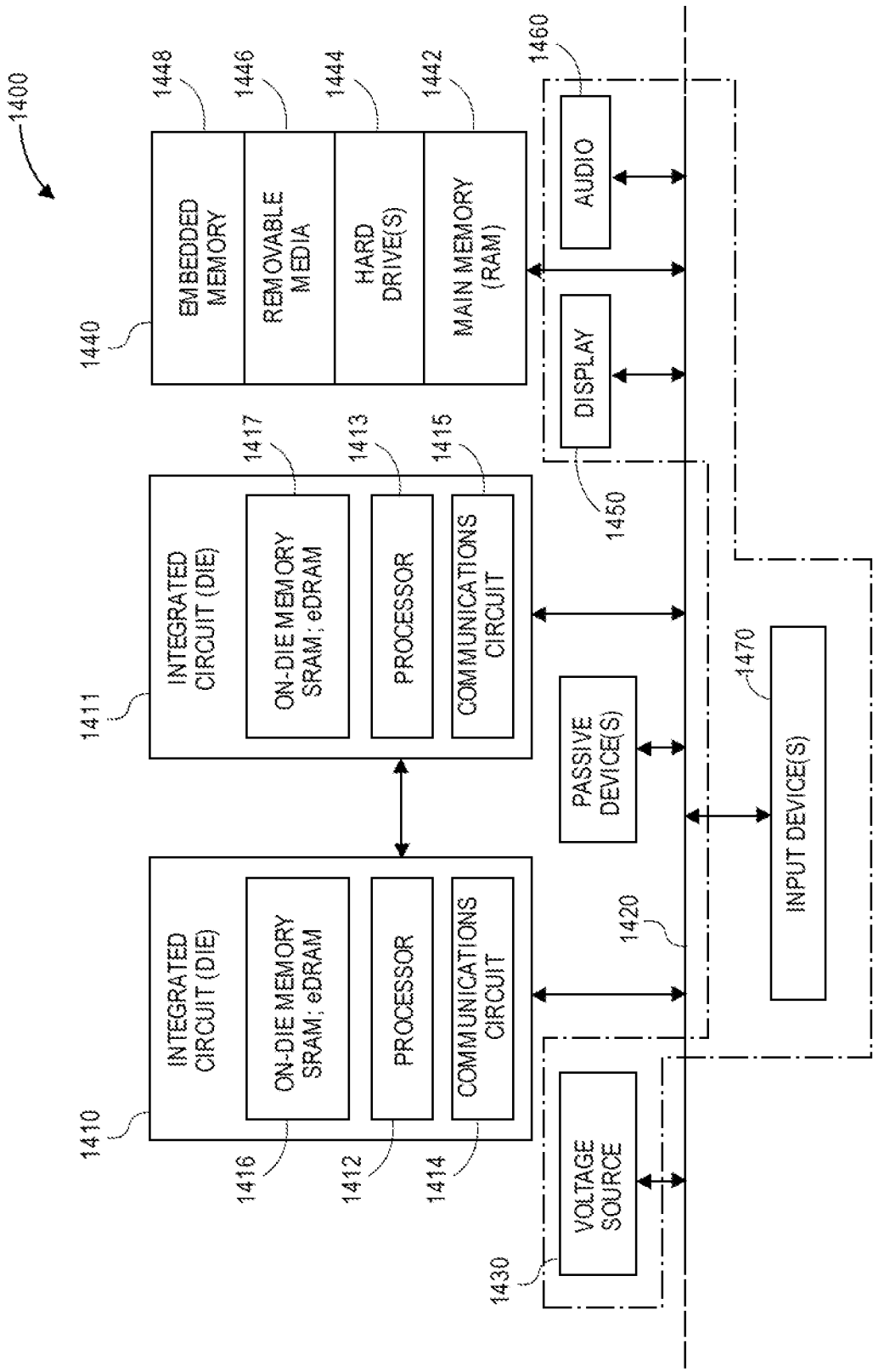
FIG. 14 is a schematic of a computer system, in accordance with an embodiment of the present invention.

FIG. 14 is a schematic of a computer system 1400, in accordance with an embodiment of the present invention. The computer system 1400 (also referred to as the electronic system 1400) as depicted can embody an active optical coupler, according to any of the several disclosed embodiments and their equivalents as set forth in this disclosure. The computer system 1400 may be a mobile device such as a netbook computer. The computer system 1400 may be a mobile device such as a wireless smart phone. The computer system 1400 may be a desktop computer. The computer system 1400 may be a hand-held reader. The computer system 1400 may be a server system. The computer system 1400 may be a supercomputer or high-performance computing system.

In an embodiment, the electronic system 1400 is a computer system that includes a system bus 1420 to electrically couple the various components of the electronic system 1400. The system bus 1420 is a single bus or any combination of busses according to various embodiments. The electronic system 1400 includes a voltage source 1430 that provides power to the integrated circuit 1410. In some embodiments, the voltage source 1430 supplies current to the integrated circuit 1410 through the system bus 1420.

The integrated circuit 1410 is electrically coupled to the system bus 1420 and includes any circuit, or combination of circuits according to an embodiment. In an embodiment, the integrated circuit 1410 includes a processor 1412 that can be of any type. As used herein, the processor 1412 may mean any type of circuit such as, but not limited to, a microprocessor, a microcontroller, a graphics processor, a digital signal processor, or another processor. In an embodiment, the processor 1412 includes, or is coupled with, a component that includes an active optical coupler, as disclosed herein. In an embodiment, SRAM embodiments are found in memory caches of the processor. Other types of circuits that can be included in the integrated circuit 1410 are a custom circuit or an application-specific integrated circuit (ASIC), such as a communications circuit 1414 for use in wireless devices such as cellular telephones, smart phones, pagers, portable computers, two-way radios, and similar electronic systems, or a communications circuit for servers. In an embodiment, the integrated circuit 1410 includes on-die memory 1416 such as static random-access memory (SRAM). In an embodiment, the integrated circuit 1410 includes embedded on-die memory 1416 such as embedded dynamic random-access memory (eDRAM).

In an embodiment, the integrated circuit 1410 is complemented with a subsequent integrated circuit 1411. Useful embodiments include a dual processor 1413 and a dual communications circuit 1415 and dual on-die memory 1417 such as SRAM. In an embodiment, the dual integrated circuit 1410 includes embedded on-die memory 1417 such as eDRAM.

In an embodiment, the electronic system 1400 also includes an external memory 1440 that in turn may include one or more memory elements suitable to the particular application, such as a main memory 1442 in the form of RAM, one or more hard drives 1444, and/or one or more drives that handle removable media 1446, such as diskettes, compact disks (CDs), digital variable disks (DVDs), flash memory drives, and other removable media known in the art. The external memory 1440 may also be embedded memory 1448 such as the first die in a die stack, according to an embodiment.

In an embodiment, the electronic system 1400 also includes a display device 1450, an audio output 1460. In an embodiment, the electronic system 1400 includes an input device such as a controller 1470 that may be a keyboard, mouse, trackball, game controller, microphone, voice-recognition device, or any other input device that inputs information into the electronic system 1400. In an embodiment, an input device 1470 is a camera. In an embodiment, an input device 1470 is a digital sound recorder. In an embodiment, an input device 1470 is a camera and a digital sound recorder.

As shown herein, the integrated circuit 1410 can be implemented in a number of different embodiments, including a package substrate having an active optical coupler, according to any of the several disclosed embodiments and their equivalents, an electronic system, a computer system, one or more methods of fabricating an integrated circuit, and one or more methods of fabricating an electronic assembly that includes a package substrate having an active optical coupler, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed package substrates having an active optical coupler embodiments and their equivalents. A foundation substrate may be included, as represented by the dashed line of FIG. 14. Passive devices may also be included, as is also depicted in FIG. 14.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the invention is to be determined entirely by the following claims, which are to be construed in accordance with established doctrines of claim interpretation.

The following paragraphs describe examples of various embodiments.

EXAMPLES

Example 1 is an active optical coupler apparatus comprising: a first optical interface to receive or transmit one or more light signals; a second optical interface to receive or transmit the one or more light signals; photonics circuitry optically coupled with the first optical interface or the second optical interface to monitor operation of the active optical coupler apparatus; electrical circuitry coupled with the photonic circuitry to facilitate the monitoring of the active optical coupler apparatus; and wherein the first optical interface and the second optical interface are optically coupled to allow light received by the first optical interface to be transmitted to the second optical interface and light received by the second optical interface to be transmitted to the first optical interface.

Example 2 may include the apparatus of example 1, wherein the apparatus is physically coupled with a substrate, and wherein the electrical circuitry is electrically coupled with the substrate, to provide an electrical coupling with the electrical circuitry.

Example 3 may include the apparatus of example 2, wherein the electrical coupling with the substrate is to provide power to the apparatus.

Example 4 may include the apparatus of example 2, wherein the photonic circuitry includes one or more photonic diodes.

Example 5 may include the apparatus of example 2, wherein to monitor operation of the active optical coupler apparatus further includes to identify data related to operational characteristics of the operation of the active optical coupler apparatus.

Example 6 may include the apparatus of example 5, wherein to identify data related to characteristics of the one or more light signals further includes transmitting the data related to the characteristics of the one or more light signals to the electrical circuitry.

Example 7 may include the apparatus of example 6, wherein the electrical circuitry transmits electrical signals based upon the identified data to the substrate.

Example 8 may include the apparatus of example 1, wherein the first optical interface is optically coupled with a photonics integrated circuit (PIC) outside the apparatus.

Example 9 may include the apparatus of example 8, wherein the first optical interface is optically coupled with the PIC outside the apparatus by a selected one of: an optical waveguide or an optical fiber.

Example 10 may include the apparatus of any one of examples 1-9 further includes a socket mechanism coupled to the second optical interface, the socket mechanism to receive an optical fiber housing that includes one or more optical fibers.

Example 11 may include the apparatus of example 10, further comprising one or more features to align the socket mechanism with the optical fiber housing.

Example 12 may include the apparatus of example 11, wherein one of the one or more features includes a selected one of: a hole to receive a pin coupled with the optical fiber housing, or a pin to be inserted into a hole of the optical fiber housing.

Example 13 may include the apparatus of example 10, further comprising a retention feature to hold the optical fiber housing into the socket mechanism.

Example 14 is an optical coupling apparatus comprising: a first optical interface to receive or transmit one or more light signals; a second optical interface to receive or transmit the one or more light signals; wherein the first optical interface and the second optical interface are optically coupled to allow light received by the first optical interface to be transmitted to the second optical interface and light received by the second optical interface to be transmitted to the first optical interface; and wherein the first optical interface is to optically couple with a photonics connector that is physically integrated with a photonics package and at or proximate to an edge of the photonics package.

Example 15 may include the apparatus of example 14, wherein the photonics connector is physically and thermally coupled with a heat spreader of the photonics package.

Example 16 may include the apparatus of example 14, wherein the first optical interface is to removably couple with the photonics connector.

Example 17 may include the apparatus of example 14, further comprising: photonics circuitry optically coupled with the first optical interface or the second optical interface to monitor the operation of the optical coupling apparatus; electrical circuitry coupled with the photonic circuitry to facilitate the monitoring of the operation of the optical coupling apparatus; and wherein the apparatus is physically coupled with a substrate coupled with the photonics package.

Example 18 may include the apparatus of example 17, wherein the substrate is a motherboard; and wherein the second optical interface is optically coupled with an optical layer in the motherboard.

Example 19 may include the apparatus of example 18, wherein an optical path between the first optical interface and the second optical interface includes one or more reflectors or mirrors.

Example 20 may include the apparatus of example 17, wherein the photonics circuitry includes a photonic crystal fiber (PCF) to sense temperature data of the optical coupling apparatus.

Example 21 may include the apparatus of example 20, wherein the electrical circuitry is to transmit an electrical signal to the substrate coupled with the photonics package.

Example 22 may include the apparatus of any one of examples 14-21, wherein the first optical interface is coupled with one or more first lenses, and wherein the second optical interface is coupled with one or more second lenses, the one or more first lenses and second lenses to facilitate reception or transmission of the one or more light signals.

Example 23 maybe a package, comprising: a substrate; a photonics IC (PIC) with the first side and a second side opposite the first side, the first side of the PIC coupled with the substrate; an XPU with a first side and a second side opposite the first side, the first side of the XPU coupled with the substrate and electrically coupled with the first side of the PIC; a heat spreader coupled with the package and thermally coupled with the second side of the PIC and the second side of the XPU; an optical coupler disposed at or proximate to an edge of the substrate and physically coupled with the substrate, the optical coupler including: a first optical interface to receive or transmit one or more light signals and optically coupled with the PIC; a second optical interface to receive or transmit the one or more light signals; and wherein the first optical interface and the second optical interface are optically coupled to allow light received by the first optical interface to be transmitted to the second optical interface and light received by the second optical interface to be transmitted to the first optical interface; and wherein the optical coupler is not physically or thermally coupled with the heat spreader.

Example 24 may include the package of example 23, further comprising an air gap at least partially surrounding the optical coupler to allow access to one or more internal chambers of the package for cleaning.

Example 25 may include the package of example 23, wherein the XPU is a selected one of: a central processing unit (CPU), a graphics processing unit (GPU), field programmable gate array (FPGA), an application specific integrated circuit (ASIC), an accelerator, or some other processing device.

Example 26 may include the package of any one of examples 23-25, wherein the PIC and the XPU are electrically coupled by a selected one of: an interconnect bridge, an embedded multi-die interconnect bridge (EMIB), a silicon interposer, organic routing on the substrate or a redistribution layer (RDL) on the substrate.

Example 27 may include the package of example 23, wherein the first optical interface optically coupled with the PIC further includes the first optical interface optically coupled with the PIC by a selected one of: an optical waveguide or an optical fiber.

Example 28 may include the package of example 23, wherein the optical coupler physically coupled with the substrate further includes the optical coupler physically coupled with the substrate by a selected one of: an adhesive, mechanical cuts within the substrate, or solder.

Example 29 may include the package of example 23, wherein the optical coupler further includes a socket mechanism coupled to the second optical interface, the socket mechanism to receive an optical fiber housing that includes one or more optical fibers.

Example 30 may include the package of example 29, wherein the optical coupler further includes one or more features to align the socket mechanism with the optical fiber housing.

Example 31 may include the package of example 30, wherein one of the one or more features includes a selected one of: a hole to receive a guide pin coupled with the optical fiber housing, or a guide pin physically coupled with the optical coupler to be inserted into a hole in the optical fiber housing.

Example 32 may include the package of example 29, further comprising a retention feature to hold the optical fiber housing into the socket mechanism.

Example 33 may include the package of example 32, wherein the retention feature is a tensioned clip physically coupled with a heat sink that is thermally and physically coupled to the heat spreader.

Example 34 is a method comprising: identifying a substrate of a package, the substrate having a first side and a second side opposite the first side; coupling a photonics IC (PIC) to the first side of the substrate; and physically coupling an active optical coupler to the first side of the substrate, the active optical coupler disposed at or proximate to an edge of the substrate.

Example 35 may include the method of example 34, wherein the active optical coupler includes: a first optical interface to receive or transmit one or more light signals and optically coupled with the PIC; a second optical interface to receive or transmit the one or more light signals; and wherein the first optical interface and the second optical interface are optically coupled to allow light received by the first optical interface to be transmitted to the second optical interface and light received by the second optical interface to be transmitted to the first optical interface; and optically coupling the PIC with the first optical interface of the active optical coupler.

Example 36 may include the method of any one of examples 34-35, wherein physically coupling the active optical coupler to the first side of the substrate further includes physically coupling the active optical coupler to the first side of the substrate by a selected one of: an adhesive, mechanical cuts within the substrate, or by solder.

What is claimed is:

1. An active optical coupler apparatus comprising:
a first optical interface to receive or transmit one or more light signals;
a second optical interface to receive or transmit the one or more light signals;
photonics circuitry optically coupled with the first optical interface and the second optical interface to monitor operation of the active optical coupler apparatus, wherein the photonics circuitry comprises electronic circuit structures, the electronic circuit structures physically intervening between the first optical interface and the second optical interface;

electrical circuitry coupled with the photonic circuitry to facilitate the monitoring of the active optical coupler apparatus; and wherein the first optical interface and the second optical interface are optically coupled to allow light received by the first optical interface to be transmitted to the second optical interface and light received by the second optical interface to be transmitted to the first optical interface.

2. The apparatus of claim 1, wherein the apparatus is physically coupled with a substrate, and wherein the electrical circuitry is electrically coupled with the substrate, to provide an electrical coupling with the electrical circuitry.

3. The apparatus of claim 2, wherein the electrical coupling with the substrate is to provide power to the apparatus.

4. The apparatus of claim 2, wherein the photonic circuitry includes one or more photonic diodes.

5. The apparatus of claim 2, wherein to monitor operation of the active optical coupler apparatus further includes to identify data related to operational characteristics of the operation of the active optical coupler apparatus.

6. The apparatus of claim 5, wherein to identify data related to characteristics of the one or more light signals further includes transmitting the data related to the characteristics of the one or more light signals to the electrical circuitry.

7. The apparatus of claim 6, wherein the electrical circuitry transmits electrical signals based upon the identified data to the substrate.

8. The apparatus of claim 1, wherein the first optical interface is optically coupled with a photonics integrated circuit (PIC) outside the apparatus.

9. The apparatus of claim 8, wherein the first optical interface is optically coupled with the PIC outside the apparatus by a selected one of: an optical waveguide or an optical fiber.

10. The apparatus of claim 1 further includes a socket mechanism coupled to the second optical interface, the socket mechanism to receive an optical fiber housing that includes one or more optical fibers.

11. The apparatus of claim 10, further comprising one or more features to align the socket mechanism with the optical fiber housing.

12. An optical coupling apparatus comprising:
a first optical interface to receive or transmit one or more light signals;
a second optical interface to receive or transmit the one or more light signals;
wherein the first optical interface and the second optical interface are optically coupled to allow light received by the first optical interface to be transmitted to the second optical interface and light received by the second optical interface to be transmitted to the first optical interface;
photonics circuitry comprising electronic circuit structures, the electronic circuit structures coupled to and physically intervening between the first optical interface and the second optical interface; and
wherein the first optical interface is to optically couple with a photonics connector that is physically integrated with a photonics package and at or proximate to an edge of the photonics package.

13. The apparatus of claim 12, wherein the photonics connector is physically and thermally coupled with a heat spreader of the photonics package.

14. The apparatus of claim 12, wherein the first optical interface is to removably couple with the photonics connector.

15. The apparatus of claim 12, wherein the
photonics circuitry is optically coupled with the first optical interface or the second optical interface to monitor the operation of the optical coupling apparatus, wherein the apparatus further comprises:
electrical circuitry coupled with the photonic circuitry to facilitate the monitoring of the operation of the optical coupling apparatus; and
wherein the apparatus is physically coupled with a substrate coupled with the photonics package.

16. The apparatus of claim 15, wherein the substrate is a motherboard; and wherein the second optical interface is optically coupled with an optical layer in the motherboard.

17. The apparatus of claim 16, wherein an optical path between the first optical interface and the second optical interface includes one or more reflectors or mirrors.

18. The apparatus of claim 15, wherein the photonics circuitry includes a photonic crystal fiber (PCF) to sense temperature data of the optical coupling apparatus.

19. The apparatus of claim 12, wherein the first optical interface is coupled with one or more first lenses, and wherein the second optical interface is coupled with one or more second lenses, the one or more first lenses and second lenses to facilitate reception or transmission of the one or more light signals.

20. A package, comprising:
a substrate;
a photonics IC (PIC) with the first side and a second side opposite the first side, the first side of the PIC coupled with the substrate;
an XPU with a first side and a second side opposite the first side, the first side of the XPU coupled with the substrate and electrically coupled with the first side of the PIC;
a heat spreader coupled with the package and thermally coupled with the second side of the PIC and the second side of the XPU;
an optical coupler disposed at or proximate to an edge of the substrate and physically coupled with the substrate, the optical coupler including:
a first optical interface to receive or transmit one or more light signals and optically coupled with the PIC;
a second optical interface to receive or transmit the one or more light signals; and
photonics circuitry comprising electronic circuit structures, the electronic circuit structures coupled to and physically intervening between the first optical interface and the second optical interface;
wherein the first optical interface and the second optical interface are optically coupled to allow light received by the first optical interface to be transmitted to the second optical interface and light received by the second optical interface to be transmitted to the first optical interface; and
wherein the optical coupler is not physically or thermally coupled with the heat spreader.

21. The package of claim 20, further comprising an air gap at least partially surrounding the optical coupler to allow access to one or more internal chambers of the package for cleaning.

22. The package of claim 20, wherein the XPU is a selected one of: a central processing unit (CPU), a graphics processing unit (GPU), field programmable gate array (FPGA), an application specific integrated circuit (ASIC), an accelerator, or some other processing device.

23. The package of claim 20, wherein the PIC and the XPU are electrically coupled by a selected one of: an interconnect bridge, an embedded multi-die interconnect bridge (EMIB), a silicon interposer, organic routing on the substrate or a redistribution layer (RDL) on the substrate.

24. The package of claim 20, wherein the first optical interface optically coupled with the PIC further includes the first optical interface optically coupled with the PIC by a selected one of: an optical waveguide or an optical fiber.

25. The package of claim 20, wherein the optical coupler physically coupled with the substrate further includes the optical coupler physically coupled with the substrate by a selected one of: an adhesive, mechanical cuts within the substrate, or solder.

* * * * *